(12) United States Patent
Amalfi et al.

(10) Patent No.: US 12,745,367 B2
(45) Date of Patent: Sep. 22, 2026

(54) APPARATUS AND SYSTEM FOR COOLING

(71) Applicant: Accelsius, LLC, Austin, TX (US)

(72) Inventors: Raffaele Luca Amalfi, New Providence, NJ (US); John Kim, Bridgewater, NJ (US)

(73) Assignee: Accelsius, LLC, Austin, TX (US)

( * ) Notice: Subject to any disclaimer, the term of this patent is extended or adjusted under 35 U.S.C. 154(b) by 422 days.

(21) Appl. No.: 18/251,986

(22) PCT Filed: Oct. 28, 2021

(86) PCT No.: PCT/EP2021/079970
§ 371 (c)(1),
(2) Date: May 5, 2023

(87) PCT Pub. No.: WO2022/101024
PCT Pub. Date: May 19, 2022

(65) Prior Publication Data

US 2024/0023282 A1 Jan. 18, 2024

(30) Foreign Application Priority Data

Nov. 12, 2020 (EP) .................................... 20207278

(51) Int. Cl.
*H05K 7/20* (2006.01)

(52) U.S. Cl.
CPC ................................ *H05K 7/20381* (2013.01)

(58) Field of Classification Search
CPC .................................................. H05K 7/20381
See application file for complete search history.

(56) References Cited

U.S. PATENT DOCUMENTS

2005/0171749 A1 8/2005 Watanabe et al.
2011/0308262 A1 12/2011 Inadomi et al.
2017/0187592 A1 6/2017 Ghosh et al.
2018/0088607 A1 3/2018 Chainer et al.
2020/0293625 A1 9/2020 Raghunathan et al.

FOREIGN PATENT DOCUMENTS

EP 2171375 B1 9/2020
JP 20088573 1/2008

OTHER PUBLICATIONS

Yuruker et al, A Metamodeling Approach for Optimization of Manifold Microchannel Systems for High Heat Flux Cooling Applications , 2019, 18th IEEE ITHERM Conference (Year: 2019).*

(Continued)

*Primary Examiner* — Mark A Connolly
(74) *Attorney, Agent, or Firm* — Geoffrey Lottenberg; Berger Singerman LLP

(57) ABSTRACT

Examples of the disclosure relate to an apparatus comprising means for: receiving a plurality of input values comprising physical parameters of, at least part of, a cooling system; using the received input values to estimate dimensionless ratios providing a measure of at least one of; heat transfer within at least part of a cooling system, pressure loss within at least part of a cooling system; using the dimensionless ratios to determine at least one performance metric of at least part of a cooling system; and using at least one determined performance metric to control one or more physical parameters of at least part of a cooling system.

11 Claims, 12 Drawing Sheets

(56) References Cited

OTHER PUBLICATIONS

Hann et al, Thermodynamic calculations of a two-phase thermosyphon loop for cold neutron sources, 2017, Cryogenics, vol. 85 , pp. 30-43 (Year: 2017).*

Rhatigan J Led—Jackson W D et al: "Numerical Model of Solar Dynamic Radiator for Parametric Analysis", Proceedings of the Intersociety Energy Conversion Engineering Conference. (IECEC). Washington, Aug. 6-11, 1989 [Proceedings of the Intersociety Energy Conversion Engineering Conference. (IECEC)], New York, IEEE, US, vol. 2, Aug. 6, 1989 (Aug. 6, 1989), pp. 923-930, XP000078842.

EPO Search Report for EP Application No. 20207278.1; Date of Completion Jun. 17, 2021.

PCT Search Report for International Application PCT/EP2021/079970; Date Completed Jan. 10, 2022.

* cited by examiner 811
813
817
Data stream from sensors
Evaluate PUE
System parameters
ML model
815

APPARATUS AND SYSTEM FOR COOLING

TECHNOLOGICAL FIELD

Examples of the disclosure relate to apparatus and systems for cooling. Some relate to apparatus and systems for controlling two-phase cooling systems.

BACKGROUND

Cooling systems are used to enable the function of devices, such as electronic devices, that generate unwanted heat during use. Increasing the efficiency of these systems can enable more heat to be transferred and improve the functioning of such devices or could be used to reduce the form factor of such devices.

BRIEF SUMMARY

According to various, but not necessarily all, examples of the disclosure there is provided an apparatus comprising means for: receiving a plurality of input values comprising physical parameters of, at least part of, a cooling system; using the received input values to estimate dimensionless ratios providing a measure of at least one of; heat transfer within at least part of a cooling system, pressure loss within at least part of a cooling system; using the dimensionless ratios to determine at least one performance metric of at least part of a cooling system; and using at least one determined performance metric to control one or more physical parameters of at least part of a cooling system.

The cooling system may comprise a single- or two-phase cooling system.

The physical parameters may be controlled for all of the cooling system or for a subsection of the cooling system.

The measure of heat transfer within the cooling system may comprise a Nusselt number and the measure of pressure loss within the cooling system comprises one or more of; frictional pressure gradient, Fanning friction factor, pressure drop.

The dimensionless ratios may be estimated using machine learning.

The dimensionless ratios may be estimated using a non-linear regression algorithm.

The at least one determined performance metric may be used to control one or more physical parameters of the cooling system in use.

The at least one determined performance metric may be used to control a flow path within the cooling system.

The at least one determined performance metric may be used to control liquid level in a downcomer of a passive two-phase cooling system.

The at least one determined performance metric may be used to control a pump within an active two-phase cooling system.

The plurality of input values may comprise information obtained from one or more sensors within the cooling system.

At least one determined performance metric may be used to modify one or more physical parameters during design of the at least part of a cooling system.

The physical parameters of the cooling system may comprise one or more of parameters relating to geometry of the cooling system, working fluid within the cooling system, thermodynamic conditions within the cooling system, flow conditions within the cooling system.

The dimensionless ratios that are used may be derived from physical measurements of the cooling system.

The dimensionless ratios that are used may be selected based on at least one of; geometry of the cooling system, operating conditions of the cooling system.

The one or more determined performance metrics may be determined by using the estimated dimensionless ratios to solve conservation of one or more of mass, momentum, energy.

According to various, but not necessarily all, examples of the disclosure there is provided a method comprising: receiving a plurality of input values comprising physical parameters of at least part of a cooling system; using the received input values to estimate dimensionless ratios providing a measure of at least one of; heat transfer within the cooling system, pressure loss with the cooling system; using the dimensionless ratios to determine at least one performance metric of the at least part of a cooling system; and using the at least one determined performance metric to control one or more physical parameters of the at least part of a cooling system.

According to various, but not necessarily all, examples of the disclosure there is provided a computer program comprising computer program instructions that, when executed by processing circuitry, cause: receiving a plurality of input values comprising physical parameters of at least part of a cooling system; using the received input values to estimate dimensionless ratios providing a measure of at least one of; heat transfer within the at least part of a cooling system, pressure loss with the at least part of a cooling system; using the dimensionless ratios to determine at least one performance metric of the at least part of a cooling system; and using the at least one determined performance metric to control one or more physical parameters of the at least part of a cooling system.

BRIEF DESCRIPTION

Some examples will now be described with reference to the accompanying drawings in which.

DETAILED DESCRIPTION

Examples of the disclosure relate to apparatus and methods for controlling cooling systems or for controlling the design of cooling systems. Examples of the disclosure can use methods such as machine learning to control one or more physical parameters of a cooling system such as a two-phase cooling system or a single-phase cooling system. The physical parameters could be parameters of the cooling system, or a sub-section of the cooling system that can be controlled during use so as to enable management of the cooling system. In some examples the parameters can be controlled during design of the cooling system so as to enable more efficient cooling systems to be designed and manufactured.

Figure 1:
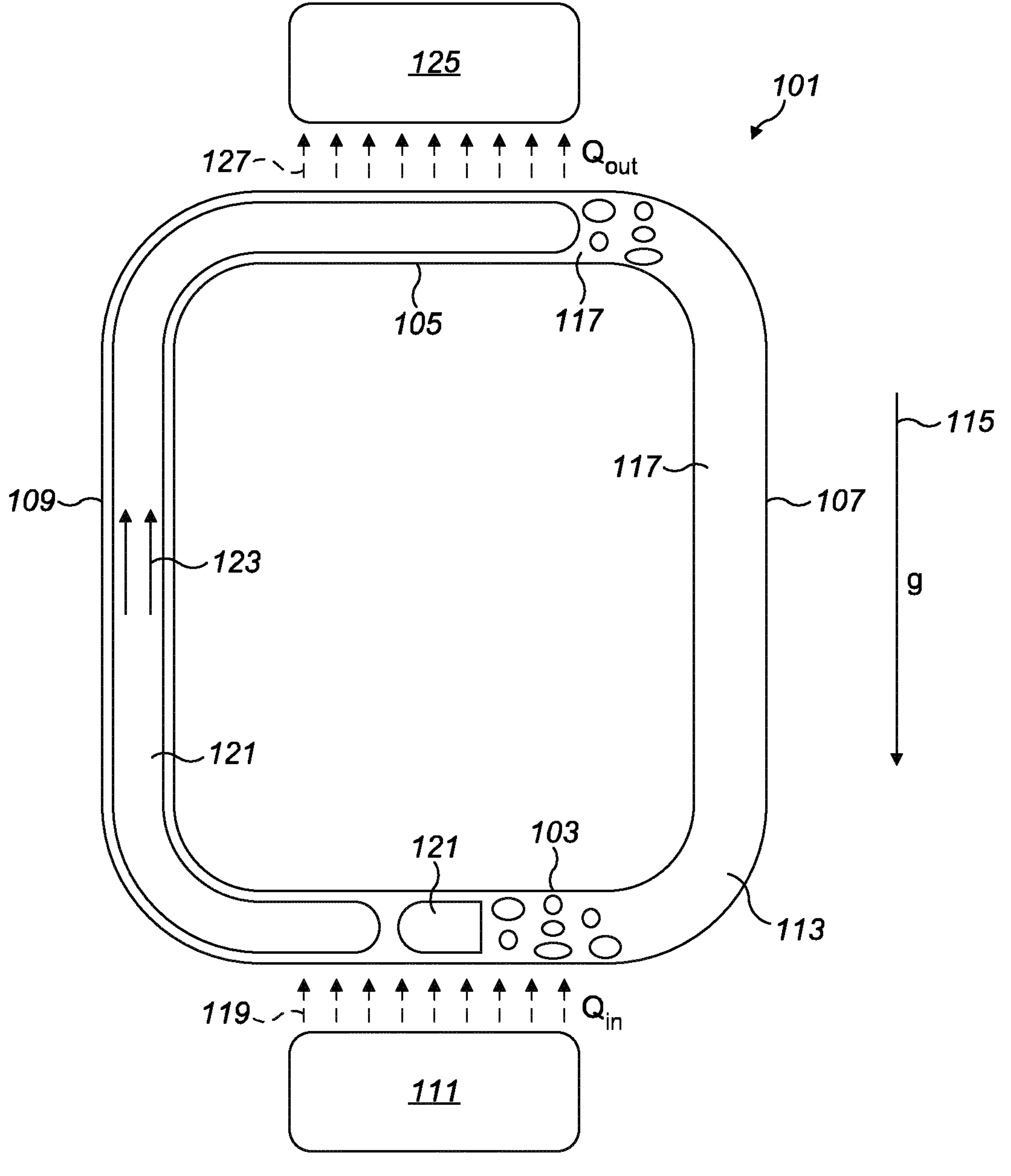
FIG. 1 shows an example two-phase cooling system.

FIG. 1 schematically shows a two-phase cooling system 101. In the example of FIG. 1 the two-phase cooling system 101 comprises a passive two-phase cooling system that is driven by gravity rather than a pump. In the example or FIG. 1 the passive two-phase cooling system 101 comprises a thermosyphon loop. Other types of two-phase cooling system can be used in other examples of the disclosure.

The thermosyphon loop shown in FIG. 1 comprises an evaporator 103, a condenser 105, a downcomer 107 and a riser 109. A working fluid 113 is provided within the thermosyphon loop. When the thermosyphon loop is in use the working fluid 113 circulates through the components of the thermosyphon loop.

The evaporator 103 is provided at the bottom of the thermosyphon loop so that the working fluid flows down the downcomer 107 into the evaporator 103 under the force of gravity as indicated by the arrow 115. The height and inner diameter of the downcomer 107 can be selected so that the static head of the fluid within the downcomer 107 causes the fluid to flow through the evaporator 103, riser 109 and condenser 105. The working fluid 113 is in the liquid phase 117 when it is in the downcomer 107.

The evaporator 103 comprises any means for transferring heat from a heat source 111 into the working fluid 113. The evaporator 103 is thermally coupled to the heat source 111. A thermal interface material could be used to enable the evaporator 103 to be thermally coupled to the heat source 111. The heat source 111 could comprise an electronic device that generates unwanted heat during used. The electronic device could be a server, router, network switch, storage device or any other suitable type of device. In some examples the heat sources can comprise a plurality of electronic devices that could provide a data centre, telecommunication equipment room, or network, a communication room, a computer room, a network room or any other suitable arrangement.

Heat is transferred from the heat source 111 to the working fluid 113 in the evaporator 103 as indicated by the arrows 119. This heat transfer causes a partial evaporation of working fluid 113 within the evaporator 103 and converts the working fluid 113 from a liquid phase 117 into a mixture of liquid and vapour phase. In particular, the evaporator 103 causes some of the working fluid 113 to be converted into the vapour phase 121 while some remains in a liquid phase 117 so that the fluid expelled from the outlet of the evaporator 103 is a two-phase mixture. The two-phase mixture can comprise droplets of vapour entrained within the liquid or other flow regimes depending on the design of the thermosyphon loop, heat load, filling ratio and any other suitable parameter.

the vapor quality of the working fluid 113 within the two-phase cooling system is the amount of vapor that is produced during the phase change process, and is calculated as the ratio between the mass of the vapor divided by the total mass of the fluid (liquid and vapor). The vapour quality of the fluid expelled from the outlet of the evaporator 103 is important for the functioning of the two-phase cooling system 101. If the vapour quality of the fluid expelled from the outlet of the evaporator 103 is too high then the two-phase cooling system 101 will operate in a friction-dominated regime with a lower thermal performance. Therefore, in order to maintain sufficient thermal performance, it can be beneficial to ensure that the vapour quality is maintained below a threshold. The threshold could be around 0.6 or any other suitable value.

The evaporator 103 is coupled to the riser 109 so that the working fluid expelled from the evaporator 103 flows from the evaporator 103 into the riser 109. This working fluid comprises a two-phase mixture where the vapour phase 121 is less dense than the liquid phase 117. The working fluid 113 within the thermosyphon loop rises through the riser 109, as indicated by the arrows 123, as a result of the balance between the buoyancy force (associated with the two-phase mixture coming out from the evaporator 103) and the gravity force (associated with the working fluid 113 coming out from the condenser 105).

The evaporator 103 can comprise structures that enable efficient transfer of heat from the evaporator 103 into the working fluid 113. For example, the evaporator 103 could comprise wick structures, microchannels, arrays of fins, a serpentine arrangement of macro-/micro-channels or any suitable combination of such features.

The condenser 105 is provided at the top of the thermosyphon loop. The condenser 105 is positioned above the evaporator 103 so that the working fluid 113 flows upwards from the evaporator 103 to the condenser 105.

The condenser 105 is coupled to the riser 109 so that the working fluid 113 in the two-phase mixture (vapour phase 121 and liquid phase 117) flows from the riser 109 into the condenser 105. The condenser 105 can comprise any means for cooling the working fluid 113. For example, the condenser 105 could be air-cooled or liquid-cooled. A liquid-cooled condenser 105 could comprise a tube-in tube configuration, shell-and-tube configuration, plate heat exchanger or any other suitable configuration or arrangement. An air-cooled condenser could comprise a louvered-fin flat tube configuration, a tube-and-fin heat exchanger or any other suitable type of configuration or arrangement.

The condenser 105 is thermally coupled to a coolant 125. A thermal interface material could be used to enable the condenser 105 to be thermally coupled to the coolant 125. In other examples the coolant 125 can be directly integrated in the condenser 105 with a wall interface separating the stream of thermosyphon working fluid 113 from the stream of coolant 125. The wall interface can comprise a highly conductive metal or metal alloy, such as copper, aluminum, brass, or any other suitable metal. In some examples the wall interface can comprise highly conductive ceramics such as Aluminum Nitride (AlN), or polymers such as filled polymer composites. The condenser 105 could be a liquid-cooled condenser or any other suitable type of condenser. The condenser can comprise any suitable geometry that enables heat to be removed efficiently from the working fluid.

The condenser 105 enables heat to be transferred from the working fluid 113 to the coolant 125 as indicated by the arrows 127. This heat transfer causes the working fluid 113 to condense, at least partly, back into the liquid phase 117. The working fluid 113 at the outlet of the condenser 105 is therefore in the liquid phase 117.

The condenser 105 is coupled to the downcomer 107 so that the working fluid 113 in the liquid phase 117 can flow down the downcomer 107 by gravity and be returned to the inlet of the evaporator 103.

Figure 2:
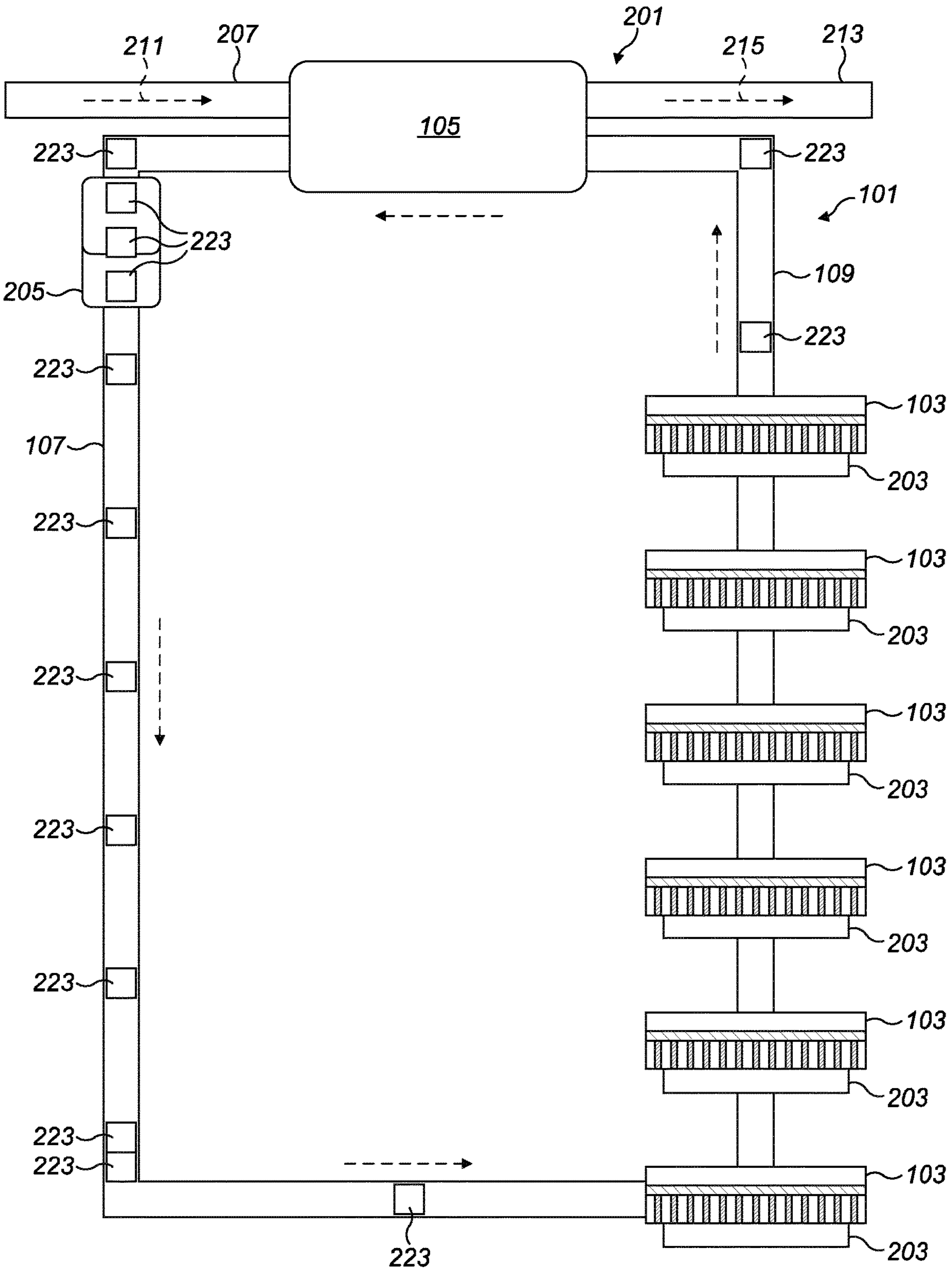
FIG. 2 shows another example two-phase cooling system.

FIG. 2 shows another example two-phase cooling system 101 comprising one or more parameters that could be controlled in examples of the disclosure. In this example the two-phase cooling system 101 comprises another thermosyphon loop that can be configured to enable cooling of a plurality of electronic devices 203 in a data centre or in any other suitable environment. Other two-phase cooling systems 101 that can be used to cool other types of devices and apparatus could be used in other examples of the disclosure.

The thermosyphon loop comprises a plurality of sensors 223. The plurality of sensors 223 are distributed throughout the thermosyphon loop to enable a plurality of input values comprising physical parameters of the thermosyphon loop to be obtained. These input values can then be used, with additional parameters such as the geometry of the two-phase cooling system 101 or the heat load from the heat sources, to estimate dimensionless ratios such as a Nusselt number or frictional pressure gradient.

In the example of FIG. 2 the thermosyphon loop comprises a plurality of evaporators 103 where each of the evaporators 103 is thermally coupled to an electronic device 203. The electronic device 203 could be a server, a router, a switch, or any other opto-electronic device. The evaporators 103 are coupled to the electronic devices 203 to enable heat from the electronic devices 203 to cause the working fluid 113 in the evaporators 103 to be evaporated. Six electronic devices 203 and corresponding evaporators 103 are shown in the thermosyphon loop of FIG. 2, however it is to be appreciated that other numbers of electronic devices 203 and evaporators 103 could be used in other examples of the disclosure.

In the example shown in FIG. 2 the evaporators 103 are arranged in series within the thermosyphon loop so that working fluid 113 expelled from a first evaporator 103 is then provided to the inlet of the next evaporator 103 within the series. In this series arrangement the working fluid 113 passes through each of evaporators 103 sequentially. As the working fluid 113 passes through the evaporators 103 the amount of working fluid 113 in the vapour phase 121 increases, as more heat is absorbed during the evaporation process.

The example thermosyphon loop of FIG. 2 comprises an accumulator 205 in the downcomer 107. The accumulator 205 can be a liquid accumulator or a receiver. The accumulator 205 can comprise any means that can be configured to store working fluid 113 in the liquid phase 117. The accumulator 205 stores working fluid 113 in the liquid phase 117. The working fluid 113 inside the accumulator 205 can comprise a portion of liquid and the remaining volume will be a two-phase mixture in saturated condition. The accumulator 205 helps to prevent the working fluid 113 in the liquid phase 117 from entering the condenser 105 due to the larger cross sectional-area of the accumulator 205 relative to the downcomer 107. This avoids flooding of the condenser 105 that could result in a decrease in thermal performance of the thermosyphon loop.

In this example the condenser 105 comprises a compact heat exchanger. Other types of condenser 105 could be used in other examples of the disclosure. The type of condenser 105 that is used can be selected based on the expected amount of heat that is to be removed from the thermosyphon loop. This can be dependent upon the number of electronic devices 203 that are to be cooled by the thermosyphon loop. In some examples, where the two-phase cooling system 101 is being used to cool a rack of servers or other similar arrangements, the condenser 105 can be located right on top of the rack (overhead condenser 105) so as to provide a sufficient driving force for a passive gravity-driven two-phase cooling system.

In the example shown in FIG. 2 a secondary cooling system 201 is coupled to the condenser 105 to enable heat to be transferred out of the thermosyphon loop and data centre environment. In this example water is the coolant and is provided at an inlet 207 as indicated by the arrow 211. The condenser 105 is configured so that heat is then transferred from the working fluid 113 of the thermosyphon loop to the water of the secondary cooling system 201. The heated water is then expelled from the outlet 213 as indicated by the arrow 215. In other examples the secondary cooling system 201 could use a different working fluid. For example, this can be a dielectric fluid that is boiling during the heat transfer process and so the heat exchanger would operate in condensation-to-evaporation mode.

In the example shown in FIG. 2 the condenser 105 has a counter-flow arrangement where the inlets for the working fluid 113 and the water are located on opposite sides of the condenser 105. In other examples the condenser can be configured to have a parallel-flow arrangement, a cross-flow arrangement or any other suitable type of arrangement.

In the example shown in FIG. 2 only a part of the secondary cooling system 201 is shown. The secondary cooling system 201 could be an active cooling system that is driven by a pump, or any other suitable type of cooling system.

The thermosyphon loop also comprises a plurality of sensors 223. The sensors 223 are positioned within the thermosyphon loop and are configured to enable measurement of one or more parameters of the thermosyphon loop. The parameters that are monitored can relate to the efficiency of the thermosyphon loop and the amount of heat being transferred by the thermosyphon loop. The measurements obtained by the sensors 223 can be used as inputs to a control system which can process the inputs to determine at least one performance metric of the thermosyphon loop. This determined performance metric can then be used to control one or more parameters of the thermosyphon loop. FIGS. 3 to 6 show example methods that can use measurements from the sensors 223 as input values to determine at least one performance metric of the thermosyphon loop or other two-phase cooling system 101.

The sensors 223 can be used to measure any suitable parameters that can be used to provide suitable input values that can be used to determine a performance metric. For example the sensors 223 could comprise temperature sensors, pressure sensors, mass flow rate sensors or any other suitable type of sensors 223. The sensors 223 can be positioned in a plurality of different positions within the thermosyphon loop so as to enable the various parameters to be measured at different locations within the thermosyphon loop.

In the examples shown in FIGS. 1 and 2 the two-phase cooling system 101 comprises a passive thermosyphon loop. It is to be appreciated that other types of two-phase cooling system 101 could be used in other examples of the disclosure. For instance, in some examples the two-phase cooling system 101 could comprise an active two-phase cooling system 101 comprising one or more pumps that are configured to pump working fluid though the system.

Figure 3:
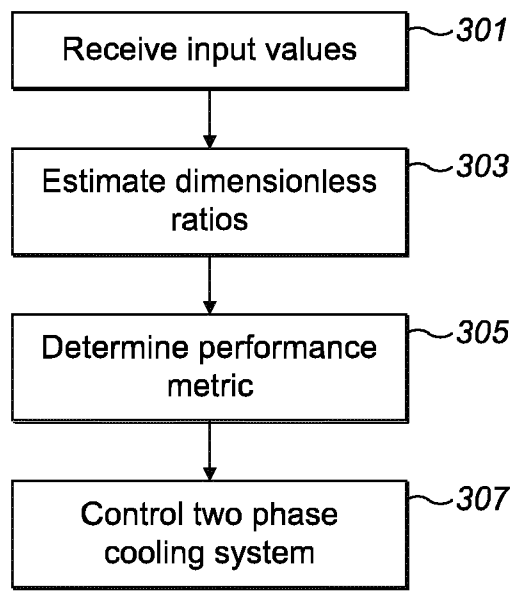
FIG. 3 shows an example method.

FIG. 3 shows an example method that can be used to enable control of cooling systems such as the two-phase cooling systems 101 shown in FIGS. 1 and 2. It is to be appreciated that variations of this method could be used in some examples of the disclosure. For example, block 303 could be omitted and the input values obtained at block 301 could be used directly as inputs to determine at least one performance metric of the cooling system (block 305).

The method comprises, at block 301, receiving a plurality of input values comprising physical parameters of a cooling system. The input values can comprise any values that give a measurement of one or more physical parameters of the cooling system.

In some examples the plurality of input values can comprise measurements that are obtained using one or more sensors 223 within the cooling system. In such examples the received input values can comprise information obtained from one or more sensors within the cooling system. For instance the sensors 223 as shown in FIG. 2 can be used to obtain measurements of temperature, pressure, mass flow rate or any other suitable parameter, while the cooling system is in use.

In some examples the plurality of input values can comprise known values for physical parameters that do not change during use of the cooling system. For example, parameters relating to geometry of the cooling system such as the width of a flow path or a height of a downcomer can be fixed so that they do not change during use. In such examples these parameters do not need to be measured but can be stored and retrieved as needed.

In some examples the plurality of input values can comprise values relating to heat load distribution. The heat load distribution can be measured while the cooling system is in use.

In some examples the plurality of input values can comprise proposed values. For instance, where the method is being used to enable design of a cooling system some initial input parameters relating to a proposed geometry of the cooling system could be used. These initial parameters could then be adjusted as part of the design process.

At block 303 the method comprises using the received input values to estimate dimensionless ratios. The dimensionless ratios can provide a measure of the performance of the cooling system.

In some examples the dimensionless ratios can be derived from physical measurements of the cooling system. For instance, the dimensionless ratios can be derived from input values received from one or more sensors within the cooling system. In some examples the dimensionless ratios can be derived from stored values relating to the cooling system. In some examples the dimensionless ratios can be derived from a combination of physical measurements and stored values.

In some examples the dimensionless ratios can provide a measure of heat transfer within the cooling system. In such examples the dimensionless ratio could comprise the Nusselt number or a value related to or derived from the Nusselt number. The Nusselt number gives a ratio of convective to conductive heat transfer across a boundary. A Nusselt number of one represents heat transfer by pure conduction. The larger the Nusselt number the more effective the convection. The Nusselt number therefore represents the enhancement of heat transfer through a fluid layer as a result of convection relative to conduction across the fluid layer.

The Nusselt number Nu for a pipe with a non-circular cross-sectional area is given by the equation:

$$Nu = \frac{h \cdot d_h}{k_{fluid}} = \frac{q_{eff}}{T_{wall} - T_{fluid}} \frac{d_h}{k_{fluid}}$$

Where h is a heat transfer coefficient, $d_h$, is a hydraulic diameter, $k_{fluid}$ is the fluid thermal conductivity, $q_{eff}$ is effective heat flux, $T_{wall}$ is a wall temperature, $T_{fluid}$ is a fluid temperature. In other systems different than pipes, the Nusselt number can be obtained by multiplying the heat transfer coefficient by a characteristic length of the specified system.

It is also to be appreciated that the wall-to-fluid temperature difference indicates an evaporation process, while the fluid-to-wall temperature difference can be used to calculate the heat transfer coefficient for a condensation process.

In some examples the dimensionless ratios can provide a measure of pressure loss within the two-phase cooling system 101. This can provide a measure of the change in pressure as the working fluid evaporates. In some examples the pressure loss can be due to interaction between a working fluid and the components of the two-phase cooling system 101. In such examples the dimensionless ratio could be derived from the frictional pressure gradient which is the frictional pressure drop per unit length.

The pressure loss gradient can be given by the equation:

$$\frac{\Delta p_{fri}}{L_{port}} = 2f \frac{G^2}{d_h \cdot \rho_{fluid}}$$

Where $\Delta p_{fri}$, is the frictional pressure drop, $L_{port}$ is the total length, f is the Fanning friction factor, G is the mass flux, $d_h$ is the hydraulic diameter, $\rho_{fluid}$ is the fluid density. In other systems different than pipes, the hydraulic diameter can be replaced by the characteristic length of the specified system.

Other dimensionless ratios that provide a measure of pressure loss can be used in other examples of the disclosure, for instance a fanning friction factor, pressure drop or other ratio could be used in other examples of the disclosure. In case of two-phase cooling system, the total pressure drop is the sum of static, momentum and frictional contribution. Other parameters and dimensionless ratios could be generated to also characterize pressure drop contributions.

It is to be appreciated that other dimensionless ratios could be used in other examples of the disclosure. For instance, the dimensionless ratios could comprise Bond number, Weber number. Boiling number, Reynolds number or any other suitable ratio or value related to these ratios.

The dimensionless ratios can be estimated using machine learning. In some examples the dimensionless ratios can be estimated using a non-linear regression algorithm. Other types of algorithm such as, support vector machine (SVM), stochastic gradient descent (SGD), nearest neighbor regression (NNR), Gaussian processes regression (GPR), Gaussian Naïve Bayes, Decision Trees Regression random forest or neural network could be used in other examples of the disclosure.

In some examples the machine learning algorithm can be configured to select which dimensionless ratios can be used to provide an optimal output or a substantially optimal output. Where there are a plurality of different dimensionless ratios available there will also be a plurality of different combinations of the dimensionless ratios that could be used to implement the method. The machine learning algorithm could select the type and/or number of dimensionless ratios to be used. The type and/or number of dimensionless ratios that are used can be selected based on factors such as geometry of the cooling system, scale operating conditions of the cooling system, scale of the cooling system, type of cooling system, or any other suitable factors.

At block 305 the method comprises using the dimensionless ratios to determine at least one performance metric of the cooling system. The performance metrics are determined by using the estimated dimensionless ratios to solve conservation of one or more mass, momentum, or energy or any other suitable parameter for the cooling system.

In some examples the performance metric can be determined by using machine learning, or any other suitable process, to solve one or more of the conservation equations. The equations can be solved for part of the cooling system or for the whole of the cooling system. In other examples, instead of solving the equations machine learning, or any other suitable process, can be used to directly connect the estimated dimensionless ratios to an output value. This direct connection can reduce computational requirements. In such examples the input values obtained at block 301 could be used to determine the performance metrics without directly calculating any dimensionless ratios (block 305).

In some examples numerical methods can be used to determine temperatures at finite points within the cooling system over time. In other examples components of the cooling system can be treated as single entities in terms of calculating temperatures. For instance, a plate heat exchanger can be treated as a single entity rather than a series of finite points.

At block 307 the method comprises using the at least one determined performance metric to control one or more physical parameters of the cooling system.

In some examples at least one determined performance metric can be used to control one or more physical parameters of the cooling system in use. For instance, the determined performance metric could be used to control a flow path in a two-phase cooling system 101 or to control a liquid level in a downcomer of a passive two-phase cooling system 101. This could be controlled by controlling one or more valves or other suitable means. In examples where the cooling system comprises an active two-phase cooling system 101 the determined performance metric could be used to control a pump. This can provide for fast and accurate control of a cooling system.

In some examples the physical parameters that are controlled when the cooling system is in use can comprise the flow circulation of the working fluid through the cooling system or through one or more components of the cooling system. In some examples the physical parameters can be controlled to optimise the flow circulation of the working fluid. The methods used to control the flow rate can be dependent upon the type of cooling system that is used. For instance, if the cooling system is a passive two-phase cooling system 101 the flow circulation can be controlled by controlling one or more valves within the two-phase cooling system 101. If the cooling system is an active system then the flow circulation could be controlled by controlling the pump speed, voltage or any other suitable factor.

The controlling of the working fluid can be applied to different parts of the cooling system or to the entire cooling system. For instance, a thermosyphon loop as shown in FIG. 2 can be coupled to a secondary cooling system 201. Such cooling systems can be used to cool data centres or other types of electronic devices. In examples of the disclosure the circulation of the working fluid could be controlled in the thermosyphon loop or in the secondary cooling system 201 or in both of them.

In some examples at least one determined performance metric can be used to modify one or more physical parameters during design of the cooling system. For instance, a simulation of the cooling system could be generated and physical parameters of the simulated system could be adjusted based on the determined performance metric. The physical parameters of the cooling system could comprise one or more of parameters relating to geometry of the cooling system, working fluid within the cooling system, thermodynamic conditions within the cooling system, flow conditions within the cooling system, and any other relevant parameters.

In some examples the determined performance metric could be used to modify features within the cooling system. For instance, the cooling system can comprise wick structures and/or microchannels that enable the flow of working fluid through the cooling system. Parameters relating to these structures, such as the diameters or lengths, could be adjusted during the design process. In some examples the heat exchangers could comprise fins or other structures to improve heat transfer, these structures could also be adjusted during the design process based on the determined performance metric.

It is to be appreciated that the method shown in FIG. 3 can be used to control part of a cooling system or the whole of a cooling system. For instance, in some examples the cooling system could comprise a plurality of cooling loops and the control could be applied to each of these individually or to the entire system.

Figure 4:
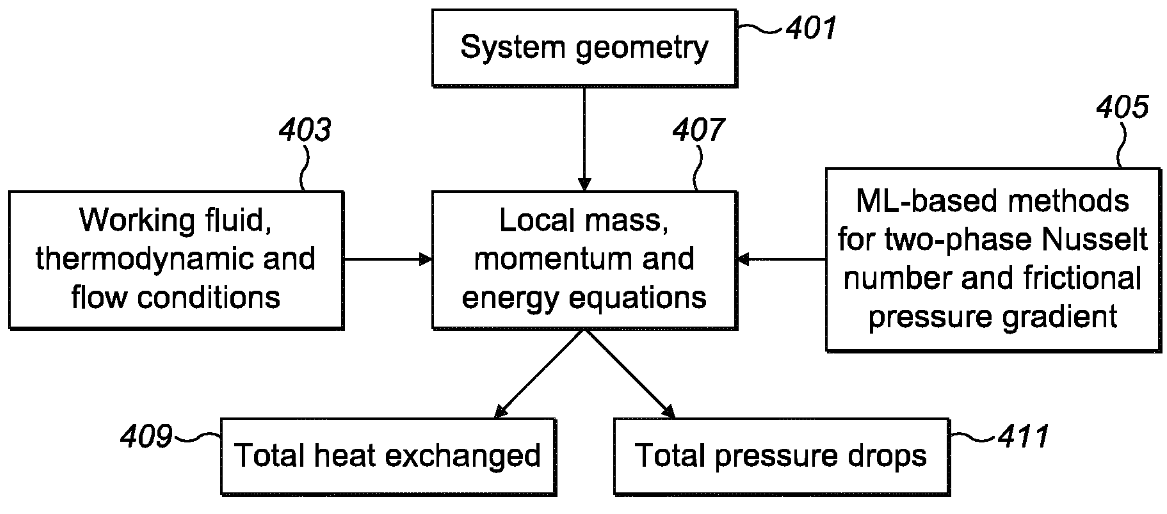
FIG. 4 shows another example method.

FIG. 4 shows another example method according to examples of the disclosure. The example method can be used for single-phase (air-based and liquid-based) cooling systems, as well as for active cooling systems that comprise a mechanical driver and passive two-phase cooling systems 101 such as the system shown in FIG. 1. The method could also be used for subsections or for components within a cooling system. For instance, in some examples the method could be used to design an evaporator 103 or a condenser 105.

In this method system geometry input values 401 and physical condition input values 403 are received. The system geometry input values could give a full system geometry for a cooling system or could give a partial system geometry. The full system geometry input values 401 can be used in examples where the cooling system is in use and so the geometry of the whole system is known. The partial system geometry input values could be used in examples where the cooling system is being designed.

The system geometry values 401 could relate to dimensions such as height and width of one or more components of a cooling system. The system geometry values 401 could be fixed values that do not change when the cooling system is in use. In some examples the system geometry values 401 could comprise one or more values that can be changed during use, for instance, one or more valves could be used to change flow paths within a cooling system which could change the effective length and/or diameter of sections of the cooling system. The system geometry values 401 could be known values that are obtained from a database or other register or could be measured as needed.

The physical condition input values 403 could comprise input values relating to one or more fluid properties or thermodynamic flow conditions within the cooling system. In examples where the cooling system is to be controlled in use at least some of the physical condition input values 403 could be obtained from one or more sensors 223 within the cooling system. In examples where a simulation is being used to design a cooling system at least some of the physical condition input values 403 could be estimated from experimental values or by using any other suitable process.

The physical condition input values 403 could relate to the working fluid, for example, they could relate to the temperature and/or pressure within the working fluid or could relate to other parameters of the working fluid such as heat capacity or the type of working fluid that is being used.

In some examples the physical condition input values 403 could comprise input values relating to one or more thermodynamic conditions within a cooling system. These conditions could be the temperature and/or pressure at one or more locations within the cooling system.

In some examples the physical condition input values 403 could comprise flow conditions such as mass flow rate or any other suitable parameter relating to the flow of working fluid within the cooling system. Such values could be measured by one or more sensors 223 or estimated from experimental data.

In the example shown in FIG. 4 the system also obtains one or more dimensionless ratios 405. In this example the dimensionless ratios 405 comprise the Nusselt number and the frictional pressure gradient. It is to be appreciated that other dimensionless ratios 405 could be used in other examples of the disclosure. The dimensionless ratios 405 can be estimated using machine learning. Machine learning, or any other suitable process, can be used to select which of the available dimensionless ratios 405 could be used to calculate the heat load and the pressure drop which can then be used to determine the performance metrics.

At block 407 equations governing conservation of mass, momentum and energy are solved. These equations can be solved for localised regions of the cooling system. For example, the cooling system can be divided into sections and the equations can be solved for specific sections of the cooling system.

As mentioned above, in some examples the equations can be solved so that a performance metric for the cooling system is calculated. In other examples machine learning, or other suitable processes, can be used to directly convert the input values 401 and 403 to the output performance metrics without ever actually solving the equations.

Once the equations have been solved one or more performance metrics 409, 411 are provided as an output. In this example a heat exchanged performance metric 409 and a pressure drop performance metric 411 are provided. The heat exchanged performance metric 409 can provide a measure of the total heat exchanged by the cooling system or by the specific section of the cooling system that is being analysed. The pressure drop performance metric 411 can provide a measure of the total pressure drop across the cooling system or across the specific section of the cooling system that is being analysed. It is to be appreciated that other performance metrics could be used in other examples of the disclosure.

Once the performance metrics 409, 411 have been obtained they can be used to control one or more physical parameters of the cooling system. For instance, if the cooling system is in use then the flow path of the working fluid could be controlled by opening or closing valves. This could control the pressure within the cooling system and can control how much heat can be transferred into the working fluid. In an active cooling system the flow of the working fluid could be controlled by controlling the pump speed, voltage or any other suitable parameter.

In examples where the method is being used to design a cooling system the performance metrics could be used to adjust one or more system geometry values 401. For instance, it could be used to adjust a physical parameter such as the length or width of part of the cooling system. The adjusted system geometry values 401 could then be used and the process could be repeated until a satisfactory output performance metric is achieved. The satisfactory output performance metric could be an optimal value, or a substantially optimal value, for a heat exchanged performance metric 409 and/or a pressure drop performance metric 411 or could be obtaining values for the heat exchanged performance metric 409 and/or the pressure drop performance metric 411 that are above a threshold value.

Figure 5:
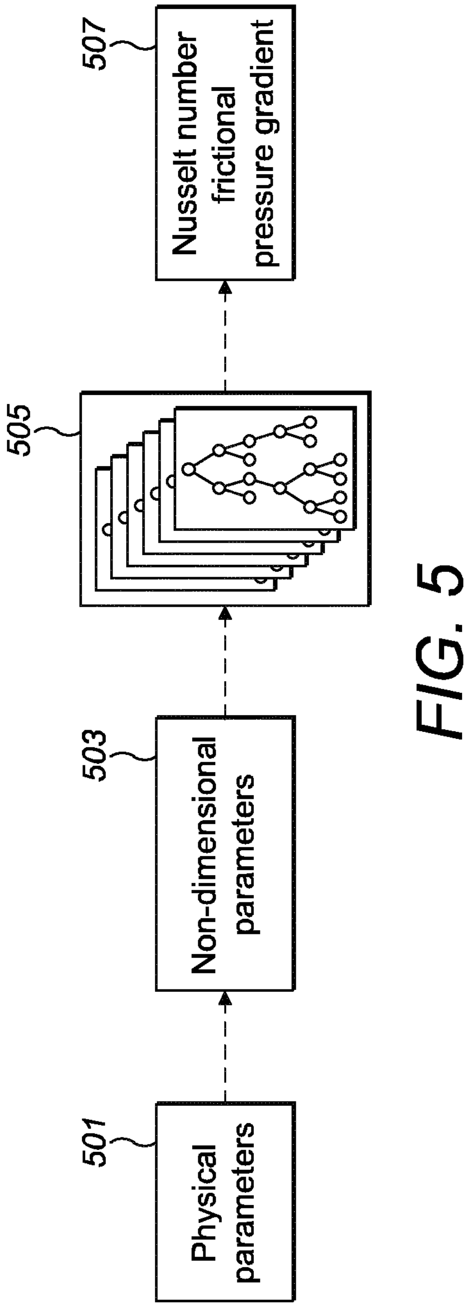
FIG. 5 shows another example method.

FIG. 5 shows an example method that can be used to estimate a dimensionless ratio.

At block 501 a plurality of input values comprising physical parameters of the cooling system are obtained. The input values can be obtained by making measurements within the cooling system or from experimental data or from any other suitable source.

At block 503 the plurality of input values are converted into non-dimensional parameters. Any suitable dimensionality reduction process can be used to convert the input values into dimensionless ratios. The dimensionless ratios could comprise Reynolds number, Bond number, density ratio or any other suitable non-dimensional parameter.

At block 505 machine learning is performed on the dimensionless ratios to obtain estimates for specific dimensionless ratios. The conversion of the input values into non-dimensional parameters reduces the dimensionality of the feature vector of the machine learning algorithm. This reduces the complexity of the machine learning algorithm.

In the example shown in FIG. 5 the machine learning algorithm that is used comprises a random forest regression. Other types of machine learning algorithm can be used in other examples of the disclosure.

At block 507 dimensionless ratios providing a measure of heat transfer within cooling system and pressure loss within the cooling system are provided. These dimensionless ratios can be the outputs of the machine learning algorithm used at block 505.

In the example of FIG. 5 the dimensionless ratios that are provided comprise a Nusselt number and a frictional pressure gradient. It is to be appreciated that other dimensionless ratios could be used in other examples of the disclosure.

Figure 6:
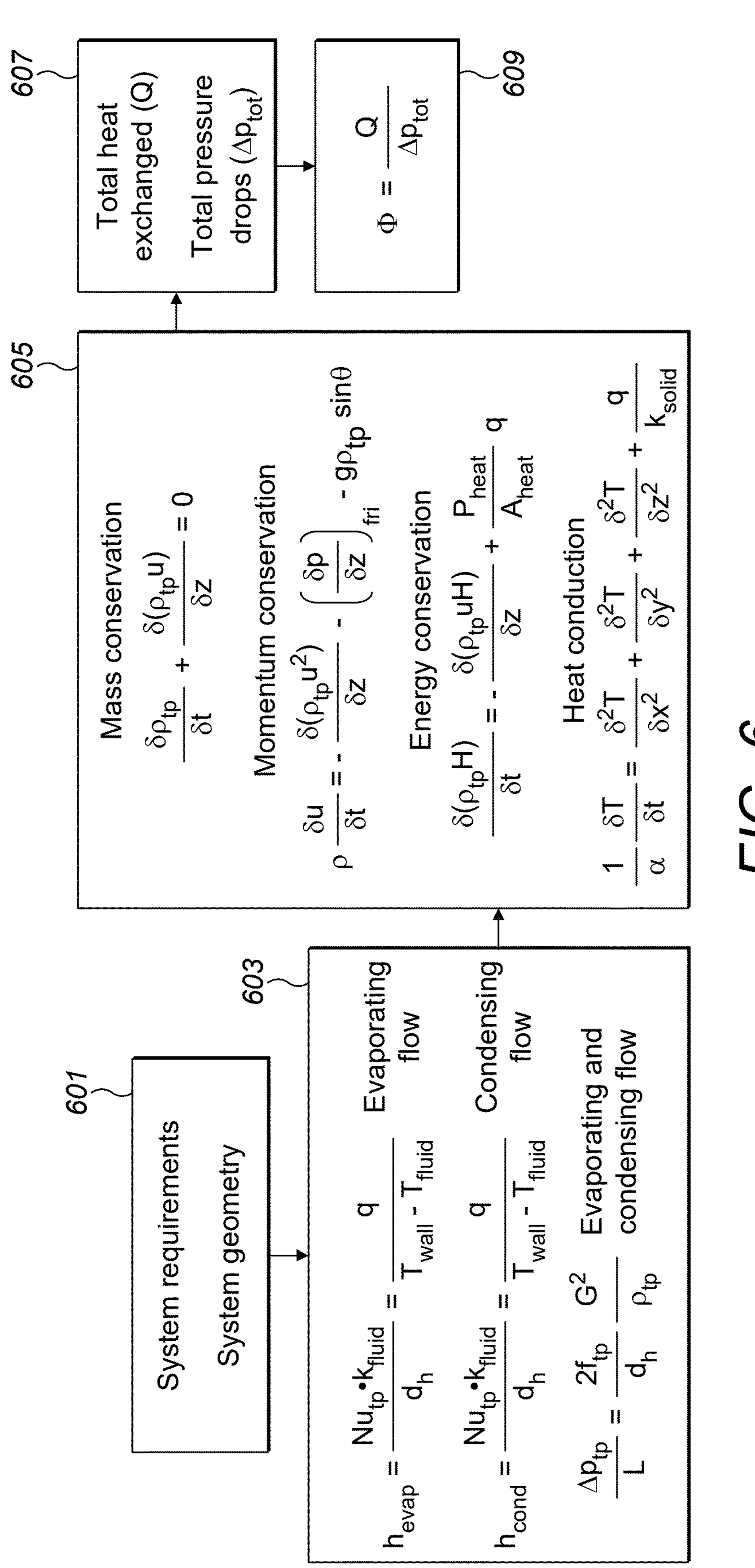
FIG. 6 shows another example method.

The dimensionless ratios that are obtained using the method shown in FIG. 5 can then be used as inputs to solve equations relating to the conservation of mass, momentum and energy within the cooling system as shown in FIG. 6.

FIG. 6 shows an example method and equations that can be used in some examples of the disclosure.

At block 601 a plurality of input values comprising physical parameters of the cooling system are provided.

These input values can comprise one or more values relating to system geometry. These values can relate to the geometry of one or more sections or components within the cooling system. These could be measured or known values of an existing cooling system or could be chosen values for a simulated cooling system.

These input values can also comprise values relating to the system requirements. In some examples the values relating to the system requirements can relate to the working fluid that is to be used. In some examples the system requirement values can relate to thermodynamic and flow conditions, for example they can relate to temperatures within the cooling system or flow rate of the working fluid or any other suitable parameters.

At block 603 the input values are used to estimate dimensionless ratios that provide a measure of heat transfer within the cooling system and pressure loss within the cooling system. In the example of FIG. 6 the dimensionless ratios comprise a Nusselt number and a frictional pressure gradient. These dimensionless ratios can be calculated by using the input values obtained at block 601 to solve equations for evaporating and condensing flow. Machine learning can be used to obtain the Nusselt number and the Fanning friction factor which can then be used to solve these equations.

For evaporating flow the Nusselt number can be obtained from:

$$h_{evap} = \frac{Nu_{tp} \cdot k_{fluid}}{d_h} = \frac{q_{eff}}{T_{wall} - T_{fluid}}$$

For condensing flow the Nusselt number can be obtained from:

$$h_{cond} = \frac{Nu_{tp} \cdot k_{fluid}}{d_h} = \frac{q_{eff}}{T_{fluid} - T_{wall}}$$

The pressure gradient for evaporating and condensing flow can be obtained from:

$$\frac{\Delta p_{tp}}{L_{port}} = \frac{2 f_{tp}}{d_h} \frac{G^2}{\rho_{fluid}}$$

At block 605 the outputs obtained at block 603 are used to solve equations governing the conservation of mass, momentum and energy. The dimensionless ratios can also be used to solve the equations governing heat conduction.

The equation governing mass conservation is given by:

$$\frac{\partial \rho_{tp}}{\partial t} + \frac{\partial (\rho_{tp} u)}{\partial z} = 0$$

The equation governing momentum conservation is given by:

$$\rho \frac{\partial u}{\partial t} = -\frac{\partial (\rho_{tp} u^2)}{\partial z} - \left(\frac{\partial p}{\partial z}\right)_{fri} - g\rho_{tp} \sin\theta$$

The equation governing energy conservation is given by:

$$\frac{\partial (\rho_{tp} H)}{\partial t} = -\frac{\partial (\rho_{tp} u H)}{\partial z} + \frac{P_{heat}}{A_{heat}} q$$

The equation governing heat conduction is given by:

$$\frac{1}{\alpha} \frac{\partial T}{\partial t} = \frac{\partial^2 T}{\partial x^2} + \frac{\partial^2 T}{\partial y^2} + \frac{\partial^2 T}{\partial z^2} + \frac{q}{k_{solid}}$$

Where u is the velocity, θ is the angle identified with the horizontal direction H is the enthalpy and α is the thermal diffusivity.

These equations for fluid flow are given here in one dimension. In these equations z is the dimension along the direction of flow. It is to be appreciated that in examples of the disclosure equations covering three dimensions could be used.

The equation governing heat conduction is given here for three dimensions. In other examples it could be solved in two dimensions or one dimension or in a steady state condition.

The equations shown in block 605 can be solved in steady-state or transient modes. In some examples additional equations that take into account flow maldistributions, flow instabilities, cold start-up, unbalanced heat load conditions, and other physical conditions that can affect a cooling system could be used.

At block 607 the outputs of the equations are obtained. These outputs comprise performance metrics relating to the physical parameters of the cooling system. In the example of FIG. 6 these outputs comprise the total heat exchanged and the total pressure drop across the cooling system. These metrics can be obtained for sections or components within the cooling system or for the whole of the cooling system.

At block 609 the overall performance metric is determined. In this example the overall performance metric is given by the ratio of the heat exchanged and the total pressure drops. Other performance metrics can be used in other examples of the disclosure.

The overall performance metric can then be used for control of one or more physical parameters of the cooling system. For instance, if the cooling system is in use the performance metric can be used to control the flow of working fluid through the cooling system. If the cooling system is a simulated system that is being analysed for design purposes then the cooling system can be controlled by adjusting any of the input values such as the values relating to system geometry. This process can then be repeated until the simulated cooling system provides a satisfactory overall performance metric. The satisfactory performance metric could be a value of the ratio of the heat exchanged and the total pressure drops that is within a predefined threshold range.

Figure 7:
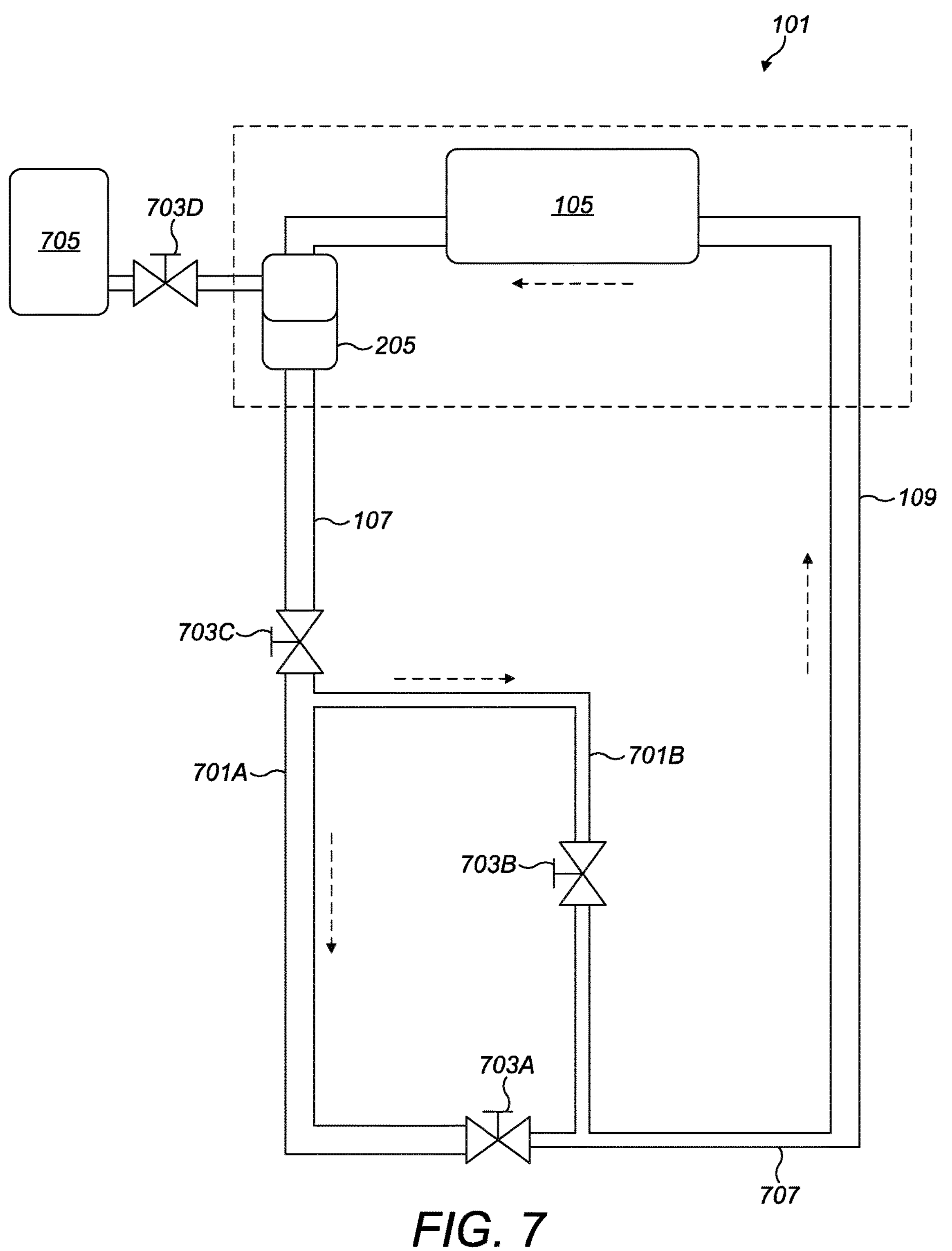
FIG. 7 shows another example two-phase cooling system.

FIG. 7 shows another example two-phase cooling system 101 that could be used in some examples of the disclosure. The evaporators 103 and electronic devices 203 are not shown in FIG. 7 for clarity. A plurality of evaporators 103 could be provided in series or in parallel or a combination of both. The two-phase cooling system 101 could also comprise one or more sensors 223 for measuring physical parameters of the two-phase cooling system 101 as shown in FIG. 2.

In the example two-phase cooling system 101 of FIG. 7 the downcomer 107 comprises a plurality of branches 701A, 701B. Each of the branches 701A, 701B provides a conduit or pipe between the condenser 105 and the one or more evaporators 103. Each of the branches 701A, 701B is configured to provide a flow path for the working fluid 113 in the liquid phase 117.

In the example shown in FIG. 7 two branches 701A, 701B are provided where the first branch has a larger diameter than the second branch. It is to be appreciated that other numbers of branches 701A, 701B, with different diameters, could be provided in other examples of the disclosure.

The two-phase cooling system 101 also comprises a plurality of valves 703A, 703B, 703C, 703D that are configured to enable the flow of working fluid 113 within the two-phase cooling system 101 to be controlled. The plurality of valves 703A, 703B, 703C, 703D could be any suitable types of valves. In some examples the valves 703A, 703B, 703C, 703D could comprise spring constant valves that can be opened and/or closed using an applied electric signal. The electrical signals that are used to control the valves 703A, 703B, 703C, 703D could be dependent upon a determined performance metric of the two-phase cooling system 101. Other types of 703A, 703B, 703C, 703D could be used in other examples of the disclosure.

In the example shown in FIG. 7 the inlet to the evaporators 103 has a smaller diameter than the riser 109. This is configured to provide a pressure force within the thermosyphon loop. This provides for unidirectional flow within the thermosyphon loop and prevents bubble formation at the inlet of the evaporators 103.

A first valve 703A is provided in the first branch 701A. The first valve 703A can be used to control flow of working fluid through the first branch 701A. A second valve 703B is provided in the second branch 701B to control flow of working fluid through the second branch 701B. In some examples the valves 703A, 703B can be controlled so that the working fluid 113 flows through either the first branch 701A or the second branch 701B. Controlling which of the branches 701A, 701B is used to provide working fluid 113 to the evaporators 103 enables adjustments of the liquid level in the downcomer 107, which allows to control flow of the working fluid 113 through the thermosyphon loop.

In some examples the two-phase cooling system 101 could be configured so that the working fluid 113 could flow through both of the branches 701A, 701B at the same time. This could enable three different configurations of the two-phase cooling system 101 to be used. In the first configuration just the first branch 701A is used, in the second configuration just the second branch 701B is used and in the third configuration both the first branch 701A and the second branch 701B are used.

The valves 703A, 703B can operated in response to a calculated performance metric. A control signal can be provided to the valves 703A, 703B to open or close the valves 703A, 703B in dependence upon the performance metric. This can be used to increase or decrease the flow of working fluid through the evaporators 103.

The two-phase cooling system 101 also comprises a third valve 703C in the downcomer 107. The third valve 703C is positioned between the accumulator 205 and the branching point where the downcomer 107 splits into two, or more, branches 701. The third valve 703C can be used to control the amount of working fluid 113 that flows into the branched section of the downcomer 107. This valve 703C could also be operated in response to a calculated performance metric.

In the example shown in FIG. 7 the two-phase cooling system 101 also comprises a reservoir 705. The reservoir 705 can comprise any means that can be configured to store working fluid 113. The reservoir 705 can be configured to store the working fluid 113 in a liquid phase 117.

The reservoir 705 is coupled to the accumulator 205 in the downcomer 107 so that the working fluid 113 can flow from the reservoir 705 to the accumulator 205. A fourth valve 703D is provided between the reservoir 705 and the accumulator 205 to enable flow from the reservoir 705 to the accumulator 205 to be controlled.

The fourth valve 703D can also be controlled in response to the determined performance metrics of the two-phase cooling system 101. The performance metrics can give an indication of whether or not additional working fluid is needed within the two-phase cooling system 101. The fourth valve 703D can be closed when no additional working fluid 113 is needed within the thermosyphon loop and can be opened when additional working fluid 113 is needed within the thermosyphon loop.

It is to be appreciated that different variations of the two-phase cooling system 101 could have different configurations of the different branches 701. For instance, in some examples more than two branches 701 could be provided. Also the branches 701 can have different diameters. In such examples the flow of working fluid 113 could be controlled by allowing the working fluid 113 to flow through one branch 701 or to flow through combinations of different branches 701.

As mentioned above the valves 703 can be operated in response to determined performance metrics of the two-phase cooling system 101. For example, if it is determined that the heat load being transferred into the working fluid 113 is above a threshold then the first valve 703A and the third valve 703C can be opened to enable the working fluid 113 to flow through the first branch 701A which has the larger diameter. This is to avoid a high static head in the downcomer 107 which could flood the condenser 105.

If it is determined that there is a low heat load within the two-phase cooling system 101 the second valve 703B and the third valve 703C can be opened to enable the working fluid 113 to flow through the second branch 701B with the narrower diameter. The second branch 701B with the smaller diameter provides for sufficient static head in low heat load cases.

Figures 8A, 8B:
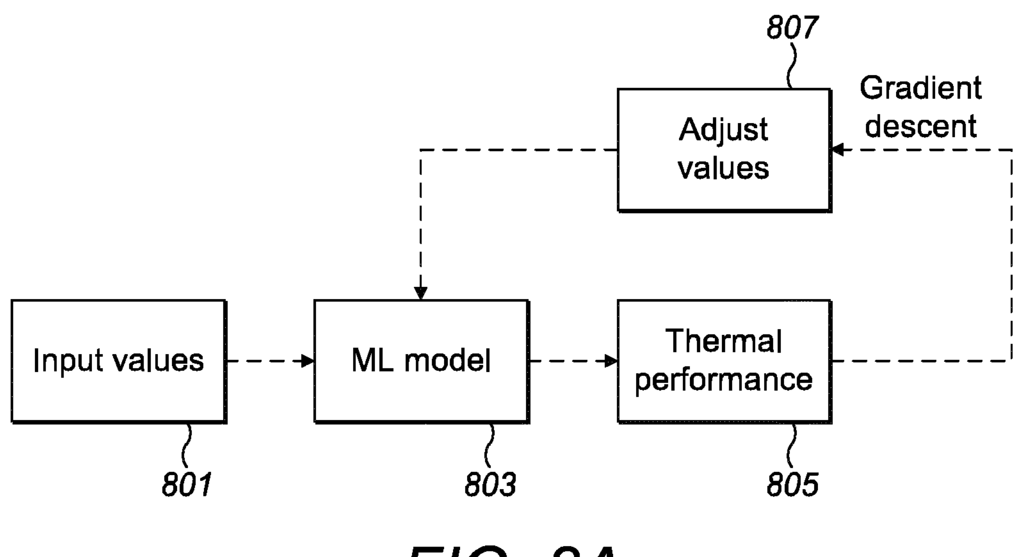
FIGS. 8A and 8B show more example methods.

FIGS. 8A and 8B show more example methods that can be used to implement examples of the disclosure.

FIG. 8A shows an example method that can be used for designing a cooling system. At block 801 a plurality of input values are obtained. These input values can include some initial design choices relating to the geometry of a simulated cooling system. These input values could also comprise one or more values estimated from experiments relating to an expected performance of a cooling system having the chosen geometry.

At block 803 a machine learning model is used. The machine learning can comprise methods as shown in FIGS. 3 to 6 or in any other suitable methods. At block 805 the machine learning provides a performance metric of the simulated cooling system as an output. In the example shown in FIG. 8A the performance metric give an indication of the thermal performance of the cooling system. The performance metric could comprise the heat exchanged, the pressure drop or any other suitable performance metric.

At block 807 the initial input values that were chosen for the geometry of the cooling system are adjusted so as to improve the performance metric. Any suitable method can be used to adjust the input values. In the example shown in FIG. 8A a machine learning gradient descent method is used. Other types of process can be used in other examples of the disclosure.

The adjusted input values are fed back as inputs to the machine learning model so that the adjusted input values can be used to estimate a new performance metric. The method of blocks 803 to 807 can be repeated until a performance metric within a desired range is obtained. The performance metric within the desired range could be an optimal performance metric, or a substantially optimal, for the cooling system.

This method provides for a fast and accurate way of designing a cooling system with high efficiencies for heat transfer. The use of machine learning to estimate the parameters to be used can provide more accurate design simulations that traditional methods.

FIG. 8B shows an example method that can be used for controlling a cooling system during use.

At block 811 a data stream is obtained from one or more sensors 223. The sensors 223 can be distributed throughout a cooling system as shown in FIG. 2 or in any other suitable arrangement. The sensors 223 can be configured to sense temperature, pressure, mass flow or any other parameter that can be used to determine a performance metric of the cooling system. The data from the sensors 223 can provide input values comprising physical parameters of the cooling system.

At block 813 the data obtained from the sensors 223 is used to calculate a performance metric of the cooling system. The performance metric could be calculated by using the data from the sensors 223 to estimate dimensionless ratios and then using the dimensionless ratios to calculate the performance metric of the cooling system. The dimensionless ratios can be estimated using machine learning or any other suitable process.

In the example of FIG. 8B the performance metric that is calculated comprises a power usage effectiveness (PUE) for the cooling system or for a part of the cooling system. Other performance metrics could be used in other examples of the disclosure.

If the performance metric is outside of a threshold range then, at block 815, the performance metric is provided as an input for a machine learning model. The data obtained from the sensors 223 at block 811 can also be provided as an input to the machine learning model. The machine learning model can be configured to determine how the parameters of the cooling system should be adjusted in order for the performance metric to be within the threshold range. The machine learning model that is used could be a non-linear regression algorithm or any other suitable type of algorithm.

The parameters of the system that are controlled could be the rate of flow of the working fluid through the cooling system, the diameter of the sections of the cooling system, the height of working fluid in the cooling system or any other suitable parameter. These parameters could be adjusted by opening closing valves as shown in FIG. 7 or by controlling a pump in an active system or by any other suitable means.

At block 817 the system parameters are adjusted in accordance with the output of the machine learning algorithm. For example, one or more control signals can be provided to one or more valve to control the opening or closing of the valves as needed. Similarly in an active cooling system the control signal could be provided to a pump or any other suitable component.

The adjusted parameters of the cooling system can then be used to calculate a new performance metric for the cooling system. The method can be repeated as needed using the adjusted parameters of the cooling system and further data obtained from the sensors to determine a new performance metric for the cooling system.

The example method of FIG. 8B therefore provides a control system for a cooling system. The use of machine learning makes the system fast and accurate and highly responsive. This can enable the cooling system to be operated in a highly efficient manner.

Figure 9A:
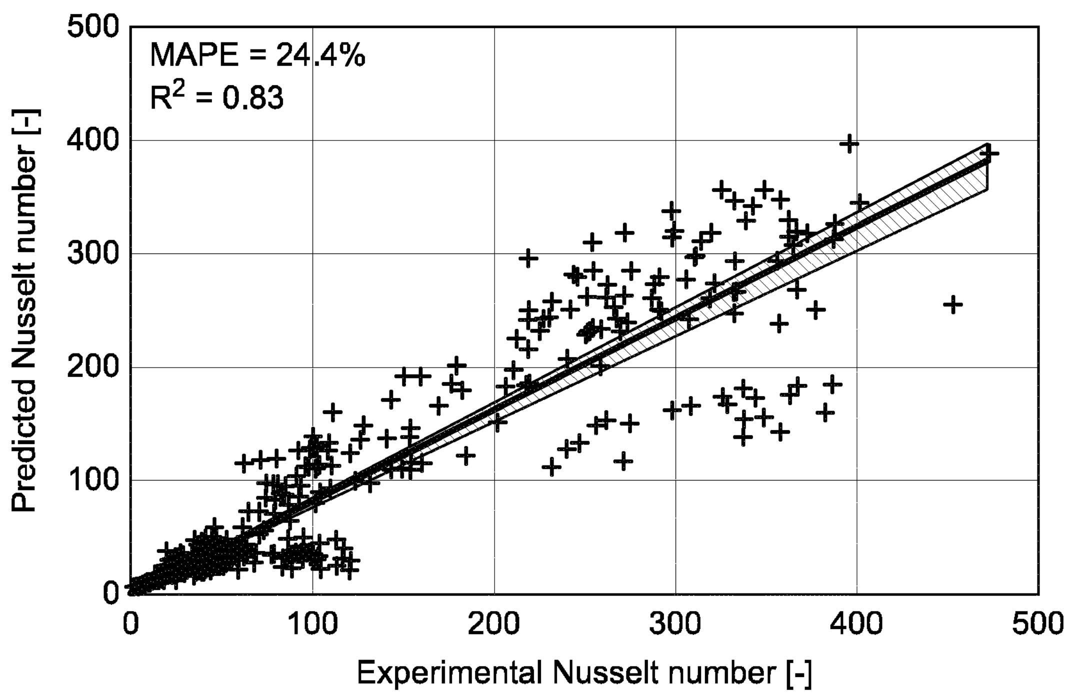
FIGS. 9A and 9B show results obtained using examples of the disclosure.
Figure 9A:
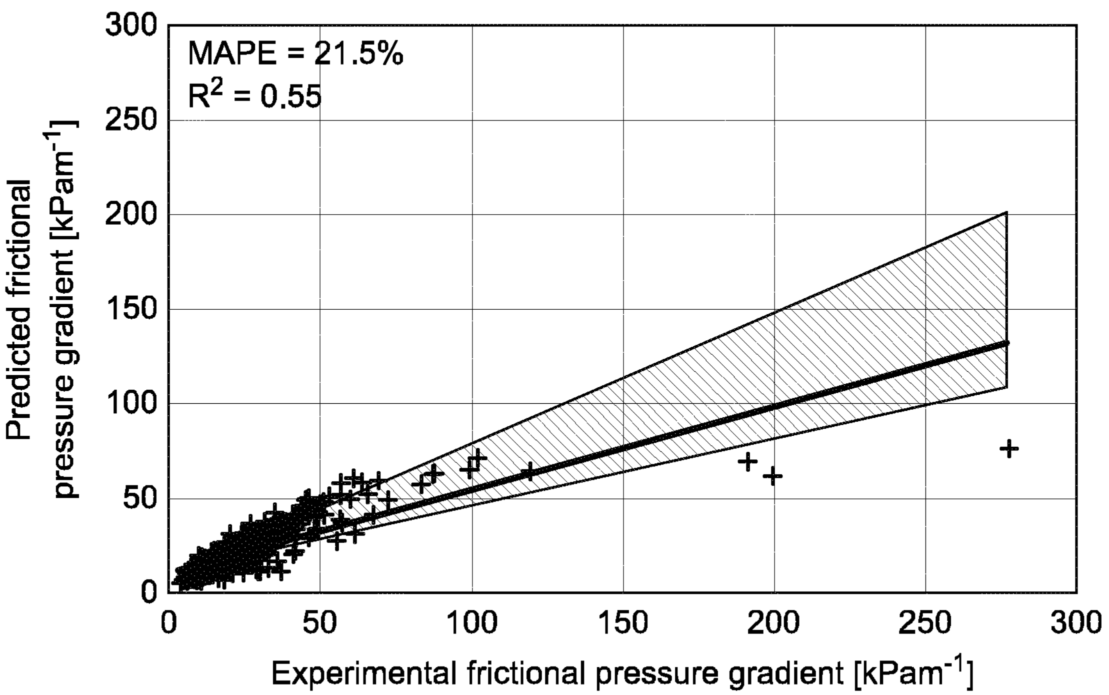
Figure 9B:
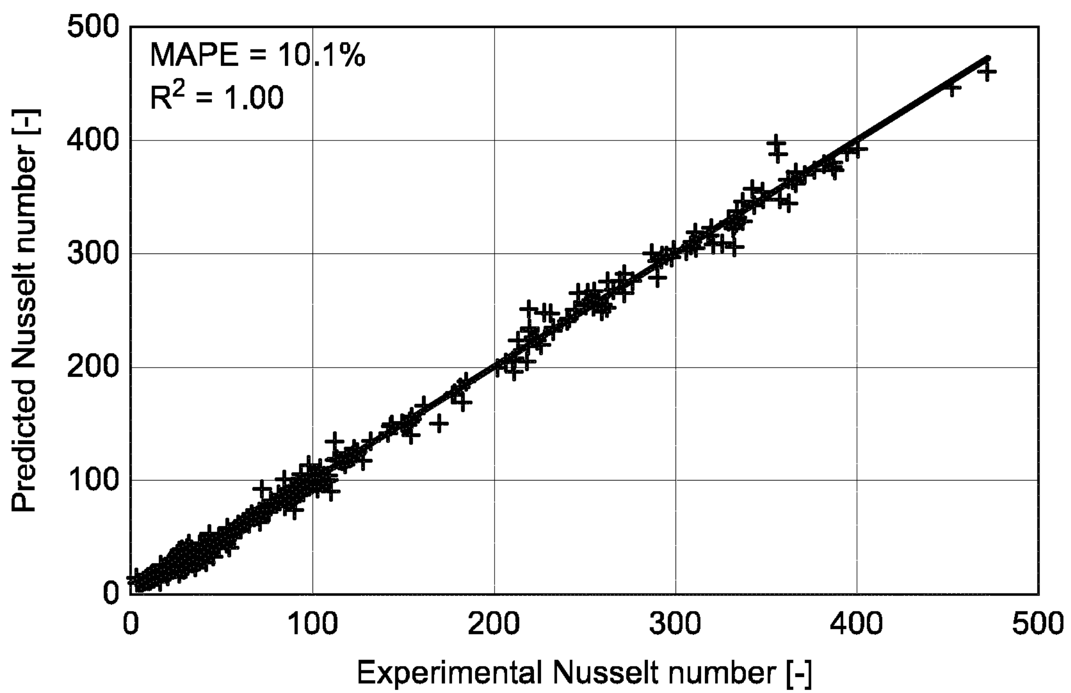
Figure 9B:
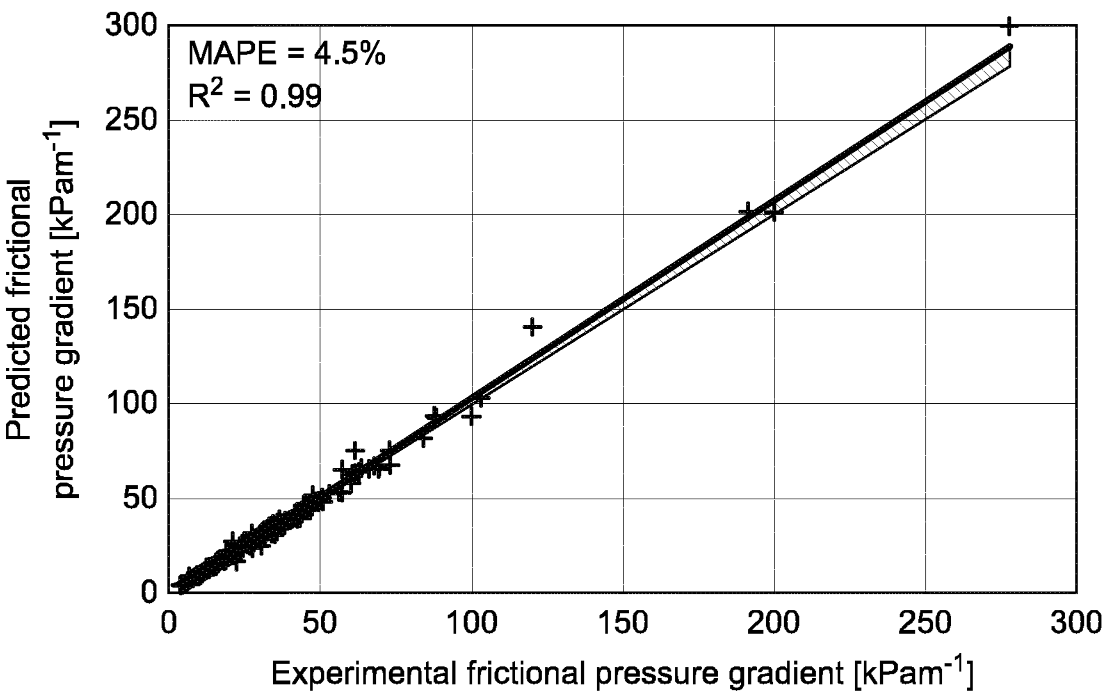

FIGS. 9A and 9B show results that have been obtained using examples of the disclosure.

FIG. 9A shows estimated values for a Nusselt number and a frictional pressure gradient for a two-phase cooling system 101 that have been obtained using the best existing methods from literature. These show a mean absolute percentage error (MAPE) of 24.4% for the Nusselt number and 21.5% for the frictional pressure gradient.

In contrast FIG. 9B shows estimated values for a Nusselt number and a frictional pressure gradient for a two-phase cooling system 101 that have been obtained using the methods of this disclosure. In this example the Nusselt number and a frictional pressure gradient were estimated using machine learning. These show a MAPE of 10.1% for the Nusselt number and 4.5% for the frictional pressure gradient. Therefore it can be clearly seen that the new methods for estimating the Nusselt number and a frictional pressure gradient provide a significant improvement over existing methods.

Figure 10A:
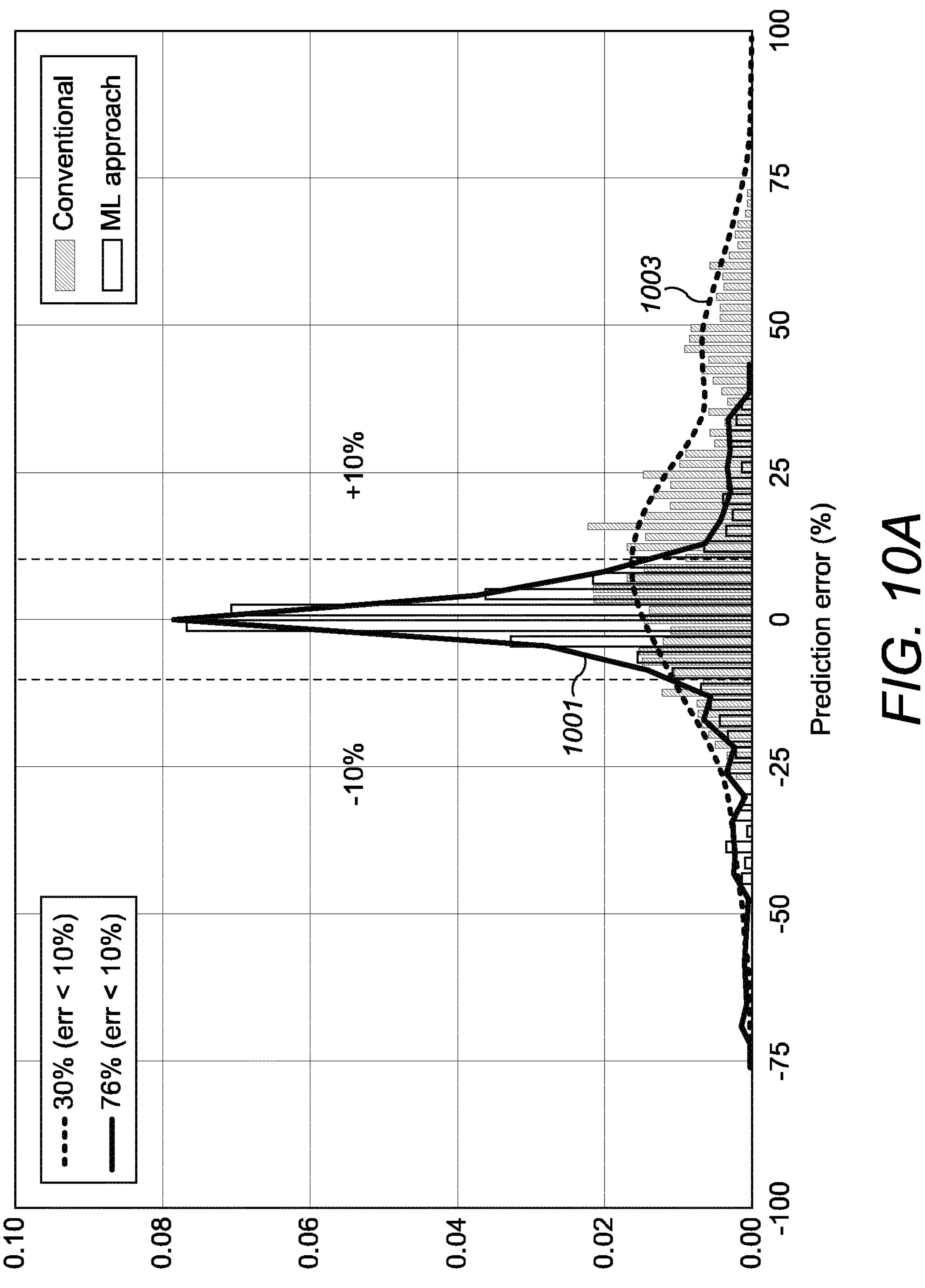
FIGS. 10A and 10B shows results obtained using examples of the disclosure.
Figure 10B:
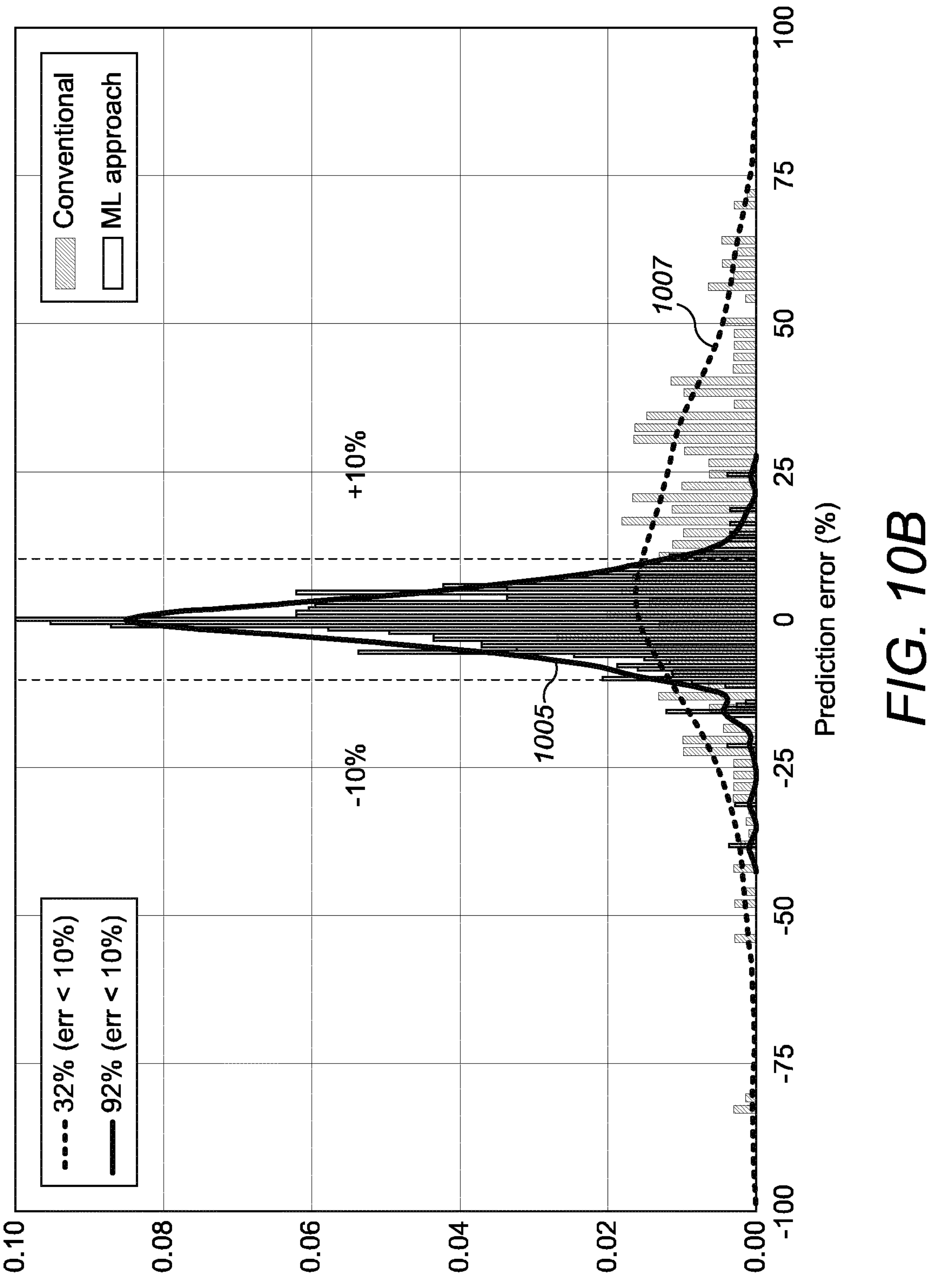

FIGS. 10A and 10B show error histograms comparing results obtained with existing methods to results obtained using examples of the disclosure.

FIG. 10A shows an error histogram for estimated values of the Nusselt number. Plot 1001 represents the results obtained using examples of the current disclosure and plot 1003 represent the results obtained using the best existing method from literature. This histogram shows that for the existing method only 30% of the estimated values of the Nusselt number had an error which was less than 10% but for the methods of the current disclosure 76% had an error which was less than 10%.

FIG. 10B shows an error histogram for estimated values of the pressure gradient. Plot 1005 represents the results obtained using examples of the current disclosure and plot 1007 represent the results obtained using the best existing method from literature. This histogram shows that for the existing methods only 32% of the estimated values of the pressure gradient had an error which was less than 10% but for the methods of the current disclosure 92% had an error which was less than 10%.

These histograms therefore clearly show that the present disclosure provides more accurate estimates of the dimensionless ratios than current best existing methods from literature. This improved accuracy leads through to improved accuracy in the calculated performance metrics and also in the parameters that are adjusted to control or design the cooling systems.

Figure 11:
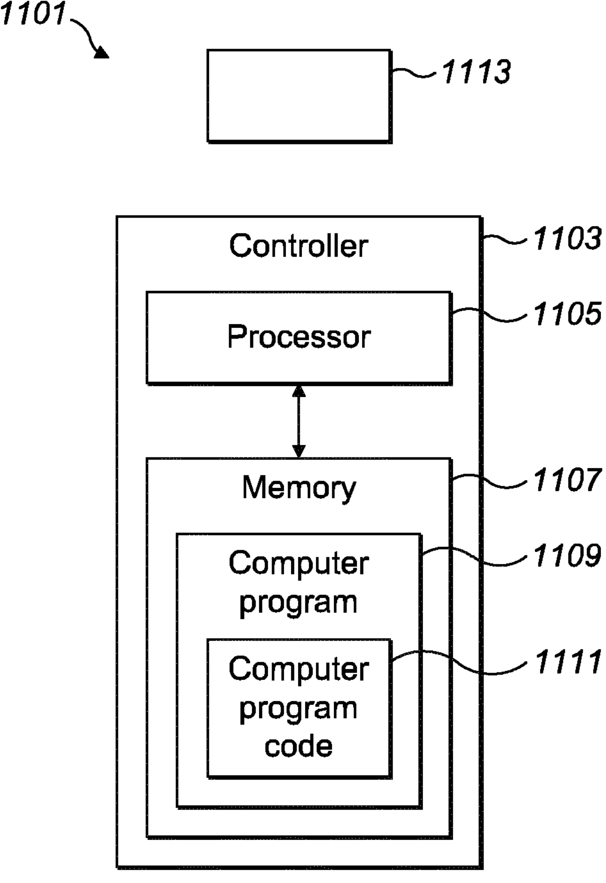
FIG. 11 shows an example apparatus.

FIG. 11 shows an example apparatus 1101 that can be used to implement examples of the disclosure.

The apparatus 1101 comprises a controller 1103. Implementation of the controller 1103 can be as controller circuitry. The controller 1103 can be implemented in hardware alone, have certain aspects in software including firmware alone or can be a combination of hardware and software (including firmware).

As illustrated in FIG. 11 the controller 1103 can be implemented using instructions that enable hardware functionality, for example, by using executable instructions of a computer program 1109 in a general-purpose or special-purpose processor 1105 that may be stored on a computer readable storage medium (disk, memory, etc.) to be executed by such a processor 1105.

The processor 1105 is configured to read from and write to the memory 1107. The processor 1105 can also comprise an output interface via which data and/or commands are output by the processor 1105 and an input interface via which data and/or commands are input to the processor 1105.

The memory 1107 stores a computer program 1109 comprising computer program instructions (computer program code 1111) that controls the operation of the apparatus 1101 when loaded into the processor 1105. The computer program instructions, of the computer program 1109, provide the logic and routines that enables the apparatus 1101 to perform the methods illustrated in FIGS. 3 to 6 and 8A and 8B. The processor 1105 by reading the memory 1107 is able to load and execute the computer program 1109.

The apparatus 1101 therefore comprises:

at least one processor 1105; and at least one memory 1107 including computer program code 1111;

the at least one memory 1107 and the computer program code 1111 configured to, with the at least one processor 1105, cause the apparatus 1101 at least to perform:

receiving 301 a plurality of input values comprising physical parameters of, at least part of, a cooling system;

using 303 the received input values to estimate dimensionless ratios providing a measure of at least one of; heat transfer within the at least part of a cooling system, pressure loss with the at least part of a cooling system;

using 305 the dimensionless ratios to determine at least one performance metric of the at least part of a cooling system; and using 307 the at least one determined performance metric to control one or more physical parameters of the at least part of a cooling system.

As illustrated in FIG. 11 the computer program 1109 can arrive at the apparatus 1101 via any suitable delivery mechanism 1113. The delivery mechanism 1113 can be, for example, a machine readable medium, a computer-readable medium, a non-transitory computer-readable storage medium, a computer program product, a memory device, a record medium such as a Compact Disc Read-Only Memory (CD-ROM) or a Digital Versatile Disc (DVD) or a solid state memory, an article of manufacture that comprises or tangibly embodies the computer program 1109. The delivery mechanism may be a signal configured to reliably transfer the computer program 1109. The apparatus 1101 can propagate or transmit the computer program 1109 as a computer data signal.

The computer program 1109 therefore comprises program instructions for causing an apparatus 1101 to perform at least the following or for performing at least the following:

receiving 301 a plurality of input values comprising physical parameters of, at least part of, a cooling system;

using 303 the received input values to estimate dimensionless ratios providing a measure of at least one of; heat transfer within the at least part of a cooling system, pressure loss with the at least part of a cooling system;

using 305 the dimensionless ratios to determine at least one performance metric of the at least part of a cooling system; and using 307 the at least one determined performance metric to control one or more physical parameters of the at least part of a cooling system.

The computer program instructions can be comprised in a computer program 1109, a non-transitory computer readable medium, a computer program product, a machine readable medium. In some but not necessarily all examples, the computer program instructions can be distributed over more than one computer program.

Although the memory 1107 is illustrated as a single component/circuitry it can be implemented as one or more separate components/circuitry some or all of which can be integrated/removable and/or may provide permanent/semi-permanent/dynamic/cached storage.

Although the processor 1105 is illustrated as a single component/circuitry it can be implemented as one or more separate components/circuitry some or all of which can be integrated/removable. The processor 1105 may be a single core or multi-core processor.

References to 'computer-readable storage medium', 'computer program product', 'tangibly embodied computer program' etc. or a 'controller', 'computer', 'processor' etc. should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device, etc.

As used in this application, the term 'circuitry' can refer to one or more or all of the following:

(a) hardware-only circuitry implementations (such as implementations in only analog and/or digital circuitry) and (b) combinations of hardware circuits and software, such as (as applicable):

(i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions and (c) hardware circuit(s) and or processor(s), such as a microprocessor(s) or a portion of a microprocessor(s), that requires software (e.g. firmware) for operation, but the software may not be present when it is not needed for operation.

This definition of circuitry applies to all uses of this term in this application, including in any claims. As a further example, as used in this application, the term circuitry also covers an implementation of merely a hardware circuit or processor and its (or their) accompanying software and/or firmware. The term circuitry also covers, for example and if applicable to the particular claim element, a baseband integrated circuit for a mobile device or a similar integrated circuit in a server, a cellular network device, or other computing or network device.

The blocks illustrated in the FIGS. 3 to 6 and 8A and 8B can represent steps in a method and/or sections of code in the computer program 1109. The illustration of a particular order to the blocks does not necessarily imply that there is a required or preferred order for the blocks and the order and arrangement of the block can be varied. Furthermore, it can be possible for some blocks to be omitted.

As mentioned above the systems, apparatus, methods and computer programs can use machine learning which can include statistical learning. Machine learning is a field of computer science that gives computers the ability to learn without being explicitly programmed. The computer learns from experience E with respect to some class of tasks T and performance measure P if its performance at tasks in T, as measured by P, improves with experience E. The computer can often learn from prior training data to make predictions on future data. Machine learning includes wholly or partially supervised learning and wholly or partially unsupervised learning. It may enable discrete outputs (for example classification, clustering) and continuous outputs (for example regression). Machine learning may for example be implemented using different approaches such as cost function minimization, artificial neural networks, support vector machines and Bayesian networks for example. Cost function minimization may, for example, be used in linear and polynomial regression and K-means clustering. Artificial neural networks, for example with one or more hidden layers, model complex relationship between input vectors and output vectors. Support vector machines may be used for supervised learning. A Bayesian network is a directed acyclic graph that represents the conditional independence of a number of random variables.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although examples have been described in the preceding paragraphs with reference to various examples, it should be appreciated that modifications to the examples given can be made without departing from the scope of the claims.

Features described in the preceding description may be used in combinations other than the combinations explicitly described above.

Although functions have been described with reference to certain features, those functions may be performable by other features whether described or not.

Although features have been described with reference to certain examples, those features may also be present in other examples whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer any exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

We claim:

1. An apparatus comprising means for:

receiving a plurality of input values comprising physical parameters of, at least part of, a cooling system;

using the received input values to estimate dimensionless ratios providing a measure of at least one of; heat transfer within the at least part of a cooling system, pressure loss with the at least part of a cooling system;

using the dimensionless ratios to determine at least one performance metric of the at least part of a cooling system;

using the at least one determined performance metric to control one or more physical parameters of the at least part of a cooling system; and wherein the at least one determined performance metric is used to modify the one or more physical parameters during design of the at least part of a cooling system.

2. An apparatus as claimed in claim 1 wherein the cooling system comprises a two-phase cooling system.

3. An apparatus as claimed in claim 2 wherein the physical parameters are controlled for all of the cooling system or for a subsection of the cooling system.

4. An apparatus as claimed in claim 3 wherein the measure of heat transfer within the cooling system comprises a Nusselt number and the measure of pressure loss within the cooling system comprises one or more of; frictional pressure gradient, Fanning friction factor, pressure drop.

5. An apparatus as claimed in claim 4 wherein the dimensionless ratios are estimated using machine learning.

6. An apparatus as claimed in claim 5 wherein the dimensionless ratios are estimated using a non-linear regression algorithm.

7. An apparatus as claimed in claim 1 wherein the physical parameters of the cooling system comprise one or more of parameters relating to geometry of the cooling system, working fluid within the cooling system, thermodynamic conditions within the cooling system, flow conditions within the cooling system.

8. An apparatus as claimed in claim 7 wherein the dimensionless ratios that are used are derived from physical measurements of the cooling system.

9. An apparatus as claimed in claim 8 wherein the dimensionless ratios that are used are selected based on at least one of; geometry of the cooling system, operating conditions of the cooling system.

10. A method comprising:

receiving a plurality of input values comprising physical parameters of at least part of a cooling system;

using the received input values to estimate dimensionless ratios providing a measure of at least one of; heat transfer within the cooling system, pressure loss with the cooling system;

using the dimensionless ratios to determine at least one performance metric of the at least part of a cooling system;

using the at least one determined performance metric to control one or more physical parameters of the at least part of a cooling system; and using the at least one determined performance metric to modify the one or more physical parameters during design of the at least part of a cooling system.

11. A computer program comprising computer program instructions that, when executed by processing circuitry, cause:

receiving a plurality of input values comprising physical parameters of at least part of a cooling system;

using the received input values to estimate dimensionless ratios providing a measure of at least one of; heat transfer within the at least part of a cooling system, pressure loss with the at least part of a cooling system;

using the dimensionless ratios to determine at least one performance metric of the at least part of a cooling system;

using the at least one determined performance metric to control one or more physical parameters of the at least part of a cooling system; and using the at least one determined performance metric to modify the one or more physical parameters during design of the at least part of a cooling system.

* * * * *